United States Patent
Jin et al.

(10) Patent No.: US 6,838,300 B2
(45) Date of Patent: Jan. 4, 2005

(54) CHEMICAL TREATMENT OF LOW-K DIELECTRIC FILMS

(75) Inventors: Changming Jin, Plano, TX (US); Phillip D. Matz, McKinney, TX (US); Heungsoo Park, McKinney, TX (US); Patricia B. Smith, Colleyville, TX (US); Andrew J. McKerrow, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/357,560

(22) Filed: Feb. 4, 2003

(65) Prior Publication Data
US 2004/0150012 A1 Aug. 5, 2004

(51) Int. Cl.[7] ............................................. H01L 21/00
(52) U.S. Cl. ............................ 438/38; 438/38; 438/139
(58) Field of Search ................................. 257/255, 632, 257/642, 678; 438/633, 597, 787, 790

(56) References Cited

U.S. PATENT DOCUMENTS 6,410,426 B1    6/2002  Xing et al.
6,576,980 B1 *  6/2003  Shao et al. ............... 257/632
6,583,046 B1 *  6/2003  Okada et al. ............. 438/622
6,583,497 B2 *  6/2003  Xia et al. ................. 257/642

* cited by examiner

Primary Examiner—David Nelms
Assistant Examiner—Thinh T Nguyen
(74) Attorney, Agent, or Firm—Jacqueline J. Garner; W. James Brady, III; Frederick J. Telecky, Jr.

(57) ABSTRACT

A method of forming an integrated circuit including an organosilicate low dielectric constant insulating layer (40) formed of a substitution group depleted silicon oxide, such as an organosilicate glass, is disclosed. Subsequent plasma processing has been observed to break bonds in such an insulating layer (40), resulting in molecules at the surface of the film with dangling bonds. Eventually, the damaged insulating layer (40) includes silanol molecules, which results in a degraded film. The disclosed method exposes the damaged insulating layer (40) to a thermally or plasma activated fluorine, hydrogen, or nitrogen, which reacts with the damaged molecules to form a passivated surface for the insulating layer (40).

20 Claims, 5 Drawing Sheets

CHEMICAL TREATMENT OF LOW-K DIELECTRIC FILMS

CROSS-REFERENCE TO RELATED APPLICATIONS

This application is related to our copending application Ser. No. 10/357,993 filed Feb. 4, 2003, entitled "Hexamethyldisilazane Treatment of Low-K Dielectric Films".

STATEMENT REGARDING FEDERALLY SPONSORED RESEARCH OR DEVELOPMENT

Not applicable.

BACKGROUND OF THE INVENTION

This invention is in the field of semiconductor integrated circuit manufacturing, and is more specifically directed to the formation and processing of dielectric films in semiconductor integrated circuits.

It is a fundamental goal, in the field of integrated circuit manufacturing, to design and manufacture integrated circuits to be as small as possible. As is fundamental in this field, the manufacturing cost of an integrated circuit corresponds strongly to the wafer area occupied by each integrated circuit die, not only by increasing the number of possible integrated circuits per manufactured wafer, but also by generally providing an increased theoretical yield for a given manufacturing defect density. In addition, the smaller device feature sizes involved in decreasing chip area also provide improved performance, and increased functionality per unit area.

Recent advances in the area of integrated circuit metallization technology have been important in decreasing the necessary chip area for modern integrated circuits. One such advance is the increased number of metal levels that are manufacturable in a device, providing both dramatic reduction in necessary chip area and corresponding dramatic increases in device density. Recent technological advances have also provided significant reductions in the line pitch of conductors in these multiple metal levels, also greatly increasing the functional density of the chip. The advent of copper metallization has also been important in providing reliable small line width conductors in modern integrated circuits. An example of a conventional copper damascene process is described in U.S. Pat. No. 6,410,426, assigned to Texas Instruments Incorporated and incorporated herein by this reference.

It is of course important to ensure good electrical isolation between adjacent metal conductors. By way of definition, the insulating material between conductors in the same metallization level is commonly referred to as the intermetal dielectric, or IMD, and the insulating material between conductors in adjacent metallization levels is referred to as the interlayer dielectric, or ILD. For performance and cost reasons, it is desirable to have adjacent conductors as close as possible to one another. This has necessitated the use of so-called "low-k" dielectric material for the insulator layers between metal conductors. Low-k dielectric materials refer to those insulating materials that have a dielectric constant lower than that of silicon dioxide. Because the capacitance between adjacent conductors depends on the dielectric constant of the insulating material that separates the conductors, as well as the thickness of this insulating material, a low-k dielectric material can be thinner than a higher-k dielectric material, while providing the same or better electrical isolation. The use of low-k dielectric materials is especially important in modern high-frequency integrated circuits.

Examples of modern low-k dielectric materials include fluorine-doped silicon dioxide (also referred to as fluorinated silicate glass, or FSG), organosilicate glass (OSG), thermoplastic organic polymers, aerogel, xerogel, and other conventional low-k insulator materials.

An important class of low-k dielectric material is referred to as substitution-group depleted silicon oxide. By way of definition, these materials have the chemical formula $R_1R_2SiO_x$, where $R_1$ and $R_2$ refer to hydrogen, oxygen, a methyl group ($CH_3$), an ethyl group ($CH_2CH_3$), phenyl, or a dangling bond. These materials provide a lower dielectric constant than stoichiometric silicon dioxide ($SiO_2$).

Of these substitution-group depleted silicon oxide low-k dielectric materials, organosilicate glasses have become popular. Examples of commercially available OSG dielectric materials include the CORAL family of low-k dielectrics available from Novellus Systems, Inc., and MSQ low-k dielectric material available from JSR Corporation, of which LKD-5109 is an example. These materials are typically spun-on to the surface of the wafer being processed, and thus are also referred to as SOG, or spin-on glasses.

It has been observed, according to this invention, that these low-k dielectric materials are susceptible to damage from plasma processes that are performed after their deposition. Plasma etching of the dielectric film itself, or of other features, can damage the surface of the remaining low-k dielectric film. Plasma ash processes for removing masking material such as photoresist that defines the trench and via locations, also damage the exposed surfaces of the low-k dielectric. Plasma-enhanced chemical vapor deposition (PECVD) processes, such as for depositing a dielectric capping layer over the low-k dielectric material after trench and via etch, can also damage the low-k dielectric material.

In the case of OSG low-k dielectric materials, it has been discovered, in connection with this invention, that the plasma damage is caused by a chemical reaction between constituents of the material and the excited species in the plasma. Specifically, it is believed, in connection with this invention, that the OSG material is damaged by the conversion of silicon-hydrocarbon bonds in the material to silicon-hydroxide bonds when the material is exposed to oxidizing or reducing plasmas. Examples of these undesirable reactions will now be described in further detail relative to FIGS. 1a through 1d.

FIG. 1a illustrates, in cross-section, a portion of a partially formed integrated circuit. Underlying structure 3 refers, in a general sense, to underlying structures and layers over which a subsequent metal conductor will be formed. As such, underlying structure 3 may include the underlying semiconductor substrate and any epitaxial layers, wells, and doped regions formed at a surface of the substrate, overlying insulator layers, conductive levels including polysilicon or metal gate layers and levels, and previous metal conductor levels, including refractory metals and copper or aluminum metallization. Low-k dielectric film 2 is disposed over underlying structure 3, and in this example is formed of an organosilicate glass. As such, in this example, silicon atoms are bound to three oxygen atoms and to one methyl group ($CH_3$), corresponding to the organic content present in organosilicate glasses. As evident from FIG. 1a, dielectric film 2 has been etched, with photoresist mask 4 present at locations defined by photolithographic patterning. At the exposed locations, dielectric film 2 is etched through to underlying structure 3; alternatively, for example in the formation of a conductor trench, dielectric film 2 may only be partially etched through at this location.

FIG. 1b illustrates the reaction of the OSG resulting from a subsequent oxidizing plasma, such as used to remove the remaining portions of photoresist 4 from the surface of dielectric film 2. The plasma illustrated in FIG. 1b is an oxygen plasma, as conventionally used in the art for photoresist removal. As evident from FIG. 1b, the methyl group in molecules at the exposed sidewalls of dielectric film 2 has been replaced by hydroxyl (OH) group, as a result of the oxidizing plasma exposure. In effect, the bonds between the silicon atoms and the methyl groups in these surface molecules are lost or broken, with the hydroxyl group replacing the lost methyl groups. The Si—OH substituted moieties are referred to as "silanol" moieties.

FIG. 1c illustrates the undesired reaction of surface molecules in MSQ OSG dielectric film 2 in the presence of a reducing plasma, such as a hydrogen plasma. In this instance, the excited neutral and/or ionic hydrogen species also react with and displace the methyl group in OSG materials near the exposed surfaces of dielectric film 2, for example along the sidewalls of the etched trench or via as shown. The bonds are either left dangling (i.e., associated with an unpaired electron spatially localized at the site of the removed methyl group) in this instance, or a hydrogen atom attaches to the silicon atom in the place of the removed methyl group. After exposure to the reducing plasma, dielectric film 2 becomes vulnerable to additional reaction with moisture, as evident from FIG. 1d. Water molecules react with the modified dielectric moieties, attaching hydroxyl groups either to the dangling bonds at the surface of dielectric film 2, or replacing the hydrogen molecules that bonded to the silicon atom after the hydrogen plasma exposure, in either case forming silanol molecules. The overall reaction in this situation follows:

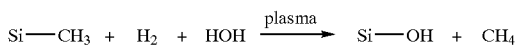

In the case of exposure to either hydrogen-containing or oxygen-containing plasmas, the Si—OH bonds at the surface of the OSG material have been observed, in connection with this invention, to degrade the integrity of low-k dielectric film 2. One form of degradation is the increase in the dielectric constant of the low-k dielectric material due to the presence of the silanol. In addition, the damaged OSG material has been observed to adsorb moisture. It has also been observed, in connection with the invention, that this degraded low-k dielectric material is vulnerable to chemical attack during exposure to wet chemical cleanups, which results in significant critical dimension (CD) loss of low-k dielectric film insulating structures.

As mentioned above, thermal annealing of the low-k dielectric film to negate already-occurred damage from plasma processing is known in the art. In connection with this invention, it is known that such thermal annealing removes physically adsorbed, but unreacted, moisture present at the surface of the low-k dielectric film. However, it has also been discovered, in connection with this invention, that the thermal activation of these silanol condensation reactions necessitates annealing temperatures in excess of 250° C. for prolonged periods of time such as on the order of $10^3$ to $10^4$ seconds, or annealing temperatures in excess of 400° C. for brief durations such as on the order of $10^2$ to $10^3$ seconds. These temperatures and processing times are both technically and economically unfavorable, due to concerns of activating other thermal processes such as copper stress migration. Significant equipment costs and increases in manufacturing times are also involved in such annealing. In addition, plasma-damaged low-k dielectric films that are annealed according to conventional processes, while removing the physically adsorbed moisture, are vulnerable to the re-adsorption of moisture and subsequent reaction which result in the formation of silanol molecules in the low-k dielectrics and the corresponding degradation of these films.

Similar effects are believed to occur in other substitution group depleted silicon oxide low-k dielectric materials, in which the bonds between the silicon atoms and the substitution groups are converted to silanol when exposed to oxidizing or reducing plasmas.

By way of further background, the modification of the bulk properties of hydrogen silsesquioxane (HSQ) with ammonia is known. This conventional treatment is for the purpose of avoiding the necessity of forming a barrier or liner layer for the subsequent deposition of copper metal over the HSQ film.

BRIEF SUMMARY OF THE INVENTION

It is therefore an object of this invention to provide a method of treating low-k dielectric films in which plasma damage of the dielectric films is negated.

It is a further object of this invention to provide such a method that retains the overall profile of the low-k dielectric film structures.

It is a further object of this invention to provide such a method that permits plasma processing following the formation of low-k dielectric films.

It is a further object of this invention to provide such a method in which certain properties of the resulting low-k dielectric film structures can be selected through selection of the reagent used in the treatment.

Other objects and advantages of this invention will be apparent to those of ordinary skill in the art having reference to the following specification together with its drawings.

The present invention may be implemented in a method of fabricating an integrated circuit, and a structure formed by such a method, in which a low dielectric constant ("low-k") film is formed, and locations of the film etched to receive conductive plugs or metal conductors. Following subsequent plasma processes, such as plasma etch of the film or of overlying conductors, or plasma removal of overlying photoresist, the low-k dielectric film is exposed to thermally or plasma activated nitrogen, fluorine, or hydrogen. The excited atoms react with dangling (unbound) bonds formed in the dielectric films that occurred as a result of the plasma exposure. The treatment converts these molecules into a form having the desired low-k and non-reactive properties for the film.

DETAILED DESCRIPTION OF THE INVENTION

The present invention will be described in connection with the formation of multiple level metal conductors in an integrated circuit, and specifically in connection with the copper metallization formed by way of a damascene process. It is believed that this invention is especially beneficial when used in that process. However, it is also contemplated that this invention will provide benefits in many other applications using low dielectric constant insulating films, and at other stages of the manufacturing process. It is therefore to be understood that this description is provided by way of example only, and is not intended to limit the scope of the invention as claimed.

Figure 2A:
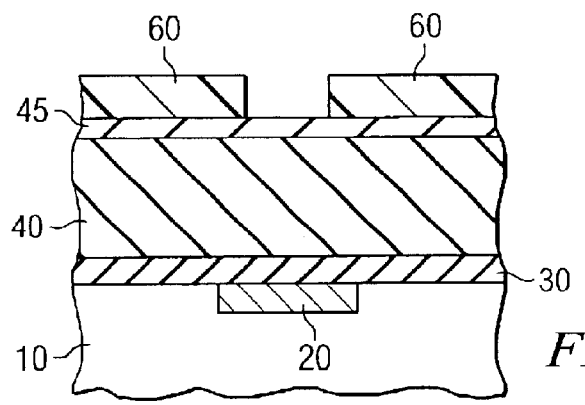
FIGS. 2a through 2d are cross-sectional views of a portion of an integrated circuit structure, illustrating its manufacture according to a first preferred embodiment of the invention.

Referring now to FIGS. 2a through 2d, the construction of an integrated circuit according to a first preferred embodiment of the invention will now be described. This example refers to a single damascene copper metallization process, although of course the invention may be used in connection with other processes and process flows. FIG. 2a illustrates, in cross-section, a portion of a partially fabricated integrated circuit, having metal conductor 20 disposed in a trench, and isolated from other trench conductors and active structures by insulator layer 10. Insulator layer 10 overlies a semiconducting surface of a substrate (not shown), and as such active devices such as transistors, resistors, diodes and the like are disposed beneath insulator layer 10. Insulator layer 10 is formed of a substitution group depleted silicon oxide low dielectric constant material. For purposes of this description, an example of this material is an organosilicate glass (OSG). In this regard, insulator layer 10 is also preferably formed according to the method of this first preferred embodiment of the invention. For purposes of this description, however, the method according to the preferred embodiments of the invention will be described in connection with the formation of overlying insulator layer 40.

Etch stop layer 30 is disposed over insulator layer 10 and metal conductor 20, in this embodiment of the invention. Low dielectric constant ("low-k") insulator layer 40 is disposed over etch stop layer 30. In this embodiment of the invention, low-k insulator layer 40 is a substitution group depleted silicon oxide low dielectric constant material, preferably an organosilicate glass such as an OSG. Examples of OSG materials include the CORAL family of low-k dielectrics available from Novellus Systems, Inc., and the LKD series of dielectric materials available from JSR Corporation, of which LKD-5109 is an example. Low-k insulator layer 40 is deposited in the conventional manner for such material, either by a spin-on technique or by chemical vapor deposition (CVD), as appropriate for the particular material. Etch stop layer 30 is preferably formed of a material that is resistant to etchants for etching low-k insulator layer 40, as used to form a via to metal conductor 20, for example. Materials useful for etch stop layer 30 include silicon nitride, silicon carbide, and other etch-resistant materials, preferably having relatively low dielectric constants.

Hardmask layer 45 is formed over the surface of low-k insulator layer 40. Hardmask layer 45 is preferably of a material that is resistant to etchants used to etch vias through low-k insulator layer 40, and may be formed of either a conductive or insulating material. Examples of materials for hardmask layer 45 include silicon nitride, silicon carbide, tantalum nitride, and titanium nitride.

Alternatively, a cap dielectric layer may overlie low-k insulator layer 40 and hardmask layer 45. Such a cap dielectric layer can protect the remaining thickness of low-k insulator layer 40 from the via and trench etches, and from chemical mechanical polishing (CMP) after metal deposition. Examples of the material of such a cap dielectric layer include silicon carbide, silicon carbonitride, titanium aluminum nitride, titanium nitride, aluminum nitride, tantalum aluminide, tantalum aluminum nitride, and similar materials.

As shown in FIG. 2a, photoresist 60 has been deposited over the surface of hardmask layer 45, and photolithographically exposed and developed to define the location at which a via is to be formed through insulator layer 40, extending to lower level metal conductor 20. The particular material for photoresist 60 will depend upon the photolithography wavelength and process to be used, as well as upon the dimensions of the eventual via. A bottom anti-reflective coating, or BARC, (not shown) may optionally be dispensed prior to photoresist 60, to underlie photoresist 60 and assist in the photolithography used to pattern photoresist 60.

Figure 2B:
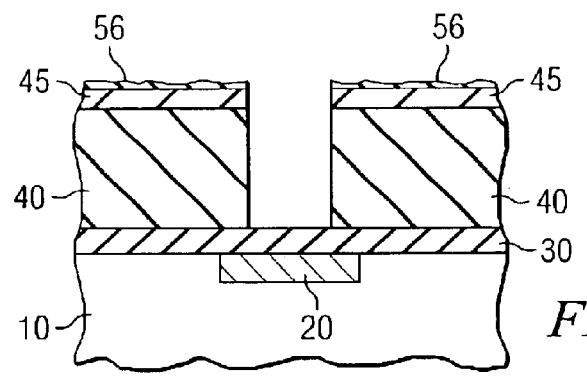

After the patterning of photoresist 60, hardmask layer 45 is first etched where not protected by photoresist 60, and then low-k insulator layer 40 is etched at those locations. These etches are preferably plasma etches, of sufficient energy, duration, and plasma conditions to first remove hardmask layer 45 and then to anisotropically etch low-k insulator layer 40 through to etch stop layer 30, resulting in the structure illustrated in FIG. 2b. The etchant used to remove hardmask layer 45 will of course depend on the composition of that layer. An example of a suitable etch for low-k insulator layer 40 formed of an OSG is a plasma etch with fluorocarbons as the activated species. The masking portions of photoresist 60 are reduced by the etch, leaving photoresist residue 56 at the protected locations of hardmask layer 45 and low-k insulator layer 40, as shown in FIG. 2b. This residue 56 may also include residue from a BARC layer, if used. Residue 56 is then removed from the surface of hardmask layer 45, preferably by way of exposure to a plasma, as conventional in the art.

The plasma process used to remove photoresist residue 56 and other polymeric residues (e.g., BARC residue) causes damage to the exposed portions of low-k insulator layer 40 after this via etch. As described above, the plasma process used to remove the photoresist and other polymeric residues causes undesirable reactions in OSG at the exposed sidewalls of low-k insulator layer 40, so that the methyl groups bonded to the silicon atoms in the OSG are removed. If a hydrogen or other reducing plasma ash is used to remove residue 56, dangling bonds or Si—H bonds form in the surface molecules of OSG insulator layer 40, along the exposed sidewalls of the via. These bonds then react with moisture in the ambient, or introduced in later wet processes, to form silanol molecules in insulator layer 40. An oxidizing plasma directly forms silanol functionality, or Si—OH bonds, as mentioned above. In either case, the silanol bonds increase the dielectric constant of insulator layer 40 at its surface locations, and thus degrade the electrical isolation provided by insulator layer 40 between adjacent conductors. The silanol also tends to adsorb moisture during subsequent processes, further degrading the properties of insulating layer 40. In addition, it has been observed that the presence of the silanol species at the surface of the sidewalls of the etched via renders these portions of insulator layer 40 vulnerable to etching during subsequent wet cleanups, such as occurs typically following the plasma cleaning processes.

Figure 2C:
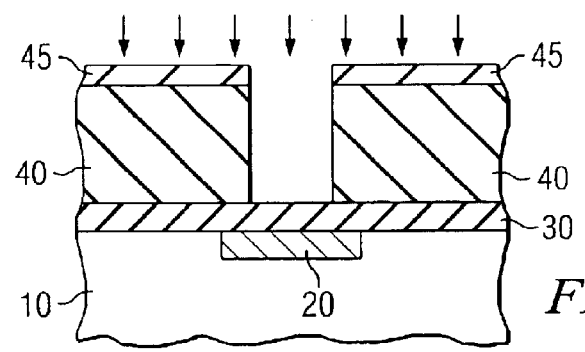

According to the preferred embodiment of the invention, after the removal of photoresist residue 56, the structure is exposed to treatment with an activated species, as illustrated in FIG. 2c. According to the preferred embodiments of the invention, the activated species operates to negate the plasma damage to insulator layer 40. In addition, the activated species may be selected to provide certain properties in the resulting film, depending upon the specific reaction carried out in this treatment. The species may be activated either thermally, by way of thermal decomposition of a precursor, or by plasma activation, or both (plasma enhanced thermal decomposition), to generate the desired atomic, molecular, and ionic activated species. In the case of plasma activation, the treatment may be carried out in situ in the same chamber in which the plasma ash was carried out. Alternatively, either of the thermal or plasma activation treatments may be performed ex situ in a separate chamber or process tool into which the integrated circuit wafer or wafers are placed.

According to the preferred embodiment of the invention, the active species used in this treatment may be nitrogen, hydrogen, or fluorine. The specific reactions resulting from each of these species will be described in connection with FIGS. 3a through 3c, respectively.

According to a first preferred embodiment of the invention, activated fluorine treats the plasma damage of insulator layer 40. The particular conditions of the fluorine treatment may vary, depending upon the process conditions, and the fluorine-bearing precursor used to provide the chemically reactive fluorine species. Examples of the chemical precursors that may be used in connection with this invention include $F_2$, $CF_4$, $C_2F_6$, HF, $CH_3F$, $C_2H_4F_2$, $NF_3$, $NH_2F$, and $SF_6$; other precursor compounds may alternatively be used as the fluorine source. As discussed above, it is contemplated that either thermal decomposition of the precursor compound, or plasma activation of the fluorine species may be used, as well as a combination of the two (i.e., plasma enhanced chemical decomposition). In the plasma activated case, it is contemplated that conventional plasma equipment can be used for this treatment, preferably the type commonly referred to as reactive ion etching (RIE) tools.

Figure 3A:
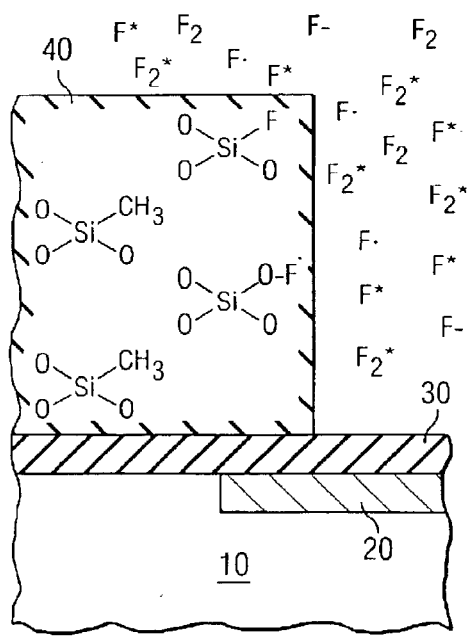
FIG. 3a is a cross-sectional view of a portion of the integrated circuit of FIGS. 2a through 2d, illustrating the reaction for treatment of plasma damage according to a first preferred embodiment of the invention.

In the case of a fluorine treatment of OSG insulator layer 40, the excited fluorine atoms react with the dangling bonds and the silanol bonds in the damaged OSG insulator layer 40. It is believed that the dangling bonds are converted to Si—F bonds, while the silanol bonds in the damaged film are converted to Si—O—F bonds. Because the fluorine reacts with both of these undesirable bonds, the treatment according to this embodiment of the invention need not wait until the exposure of insulator layer 40 to water, but can be performed immediately after the damaging plasma treatment. In either case, because the reactive fluorine species are thermally or plasma activated, the treatment chemical activity occurs at the surface of insulator layer 40. FIG. 3a illustrates these reactions of the activated fluorine with damaged OSG insulator layer 40.

Figure 3B:
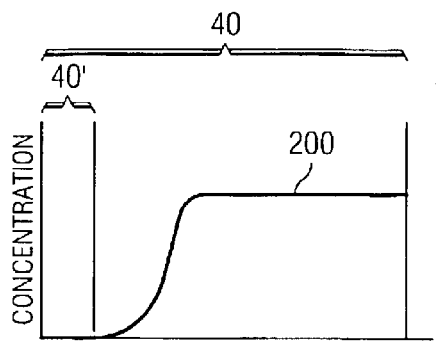
FIGS. 3b and 3c are plots of the concentration of various constituents of an insulating layer in the integrated circuit of FIGS. 2a through 2d, before and after the repair treatment according to the first preferred embodiment of the invention.
Figure 3C:
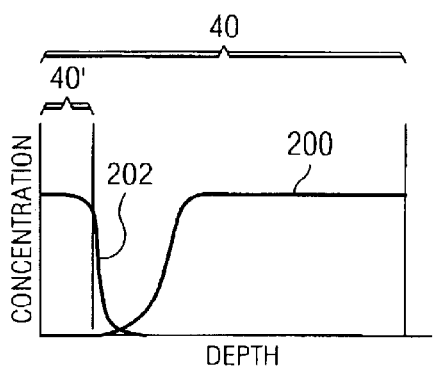

The reduction in the number of silanol molecules, and the corresponding increase in fluorine bonds, resulting from this embodiment of the invention are believed to be detectable by way of modern measurement techniques. FIGS. 3b and 3c are depth profiles of the composition of insulator layer 40 according to the preferred embodiment of the invention, illustrating the effect of plasma damage to layer 40 and its conversion according to this embodiment of the invention. In FIG. 3b, plot 200 shows the concentration of silicon-hydrocarbon (Si—$CH_3$) in OSG insulator layer 40. The surface portion (thickness 40' in FIG. 3b) has been damaged by plasma processing, such as the removal of photoresist. Within damaged thickness 40', the silicon-hydrocarbon (Si—$CH_3$) concentration is much reduced; as noted above, the loss of these bonds is contemplated to result in either dangling bonds or silanol bonds in this portion of the film.

FIG. 3c, on the other hand, illustrates the effect of the fluorine treatment according to this embodiment of the invention. While the silicon-hydrocarbon (Si—$CH_3$) concentration remains low in surface thickness 40' of the OSG insulator layer 40, a higher concentration of silicon-fluorine (Si—F) bonds is now present within thickness 40', as shown by plot 202 in FIG. 3c. This conversion of the dangling and silanol bonds to the desired silicon-fluorine (Si—F) bonds eliminates many of the deleterious effects of the damaged insulator layer 40.

Figure 3D:
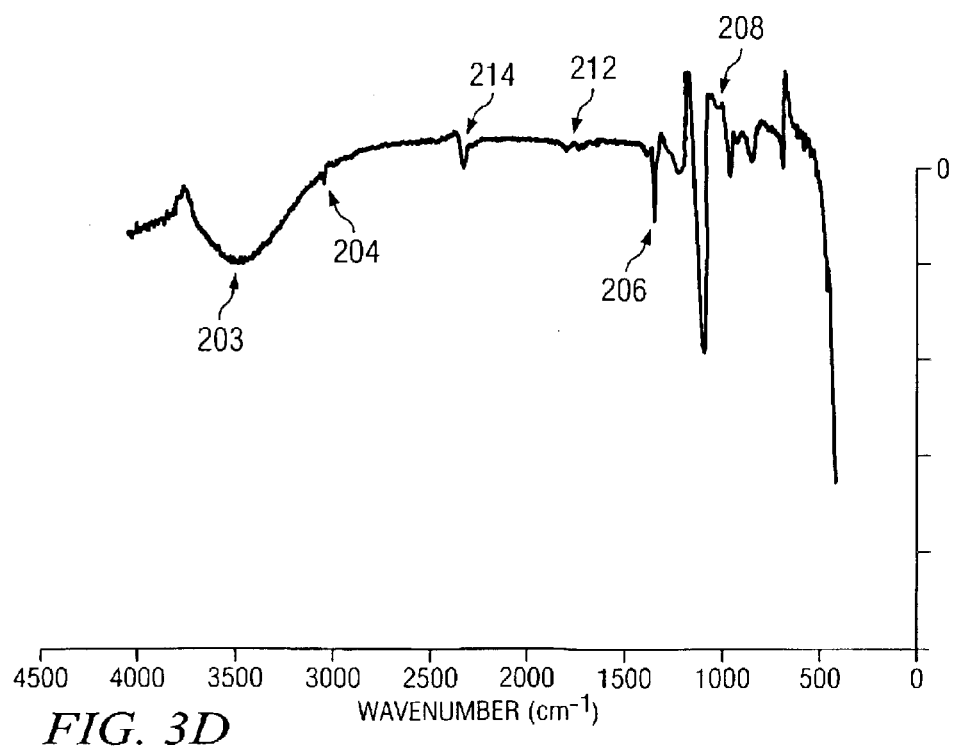
FIG. 3d is an absorption spectrum difference plot illustrating differences in the composition of low-k dielectric film from the repair treatment according to the first preferred embodiment of the invention.

FIG. 3d is an absorption spectrum difference plot generated by Fourier Transform Infrared Spectroscopy (FTIR), taken of a portion of OSG insulator material, after processing with an activated fluorine treatment according to this embodiment of the invention. As known in the art, FTIR is a technique by way of which energy of varying wavelength in the infrared band is generated and irradiates the sample under analysis. The frequencies at which this energy is absorbed by the material corresponds to quantum transition energies of the material. Specifically, if the material has a transition that is related by Planck's constant to the frequency of the incident radiation, the radiation is absorbed by the material. Conversely, if the incident radiation frequency does not satisfy the Planck expression, then the radiation will be transmitted. A plot of the frequency of the incident radiation against a measure of the percent of the radiation that is absorbed by the sample is the absorption spectrum of the material.

In the example illustrated by the difference plot of FIG. 3d, OSG insulator layer 40 was damaged by plasma removal of photoresist, and then treated by way of plasma decomposition of a mixture of hydrogen and carbon tetrafluoride ($CF_4$), at a temperature of 60° C., for 120 seconds. FIG. 3d is a difference plot, illustrating the difference in absorbance between OSG material before and after the plasma fluorine treatment according to the preferred embodiment of the invention is plotted, with those frequencies (wavenumbers) for which no difference is seen appearing flat at about the 0.000 level. As evident from FIG. 3d, lower frequency negative absorption difference 203 at a wavenumber of about 3500 indicates a significant loss of silanol (Si—OH). Positive absorption difference 208, at a wavenumber of about 935, indicates in increase of Si—F, replacing the lost silanol bonds. Other indications in this plot illustrate other effects of the treatment, such as a slight loss of methyl groups' (differences 204, 206 at a wavenumber of about 3000 and 1300, respectively), and a possible loss of physioadsorbed water (difference 212 at a wavenumber of about 1800). An effect corresponding to an Si—H stretch and slight loss, is evident by difference 214 at a wavenumber of about 2400. This experimental result illustrated in FIG. 3d is believed to confirm that the activated fluorine reacts with silanol and dangling bonds in the manner described in connection with this preferred embodiment of the invention, improving the attributes of the film. FIG. 3d also illustrates that insulator film 40 is structurally different from conventional OSG insulator films, in that a significant decrease in the number of silanol molecules, and an increase in Si—F and Si—O—F bonds, can be detected by modern measurement techniques, such as the FTIR technique.

In addition to removing the silanol and dangling bonds in insulator layer 40, the fluorine treatment according to this embodiment of the invention converts insulator layer into a film having desirable properties. The fluorine surface treatment tends to passivate the low-k material of insulator layer 40, so that the film is less vulnerable to subsequent processing. More specifically, as known in the art, fluorosilicate glasses, such as fluorine-doped silicon dioxide, are often used in the fabrication of integrated circuits. As such, many processes that are compatible with these materials are used in conventional integrated circuit fabrication. The treatment according to this embodiment of the invention, by incorporating fluorine into the surface of insulator layer 40, causes insulator layer 40 to have some of the properties of a fluorosilicate glass, and thus be more robust to subsequent processing.

As noted above and as will be described below, this embodiment of the invention can be used in connection with damascene copper metallization. It is known in the art that fluorine tends to getter copper atoms. As a result, the fluorine present in insulator layer 40 following the treatment according to this embodiment of the invention will getter copper atoms, such as may pre-sputter from the bottom of the via through insulator layer. The treated portion of insulator layer 40 thus provides a barrier to diffusion of these copper atoms into the interior of insulator layer 40, and improves the adhesion of subsequent barrier layers and metallization formed into this via.

According to a second embodiment of the invention, insulator layer 40 is treated with activated hydrogen to repair damage to the film from plasma processes such as the removal of photoresist. The particular conditions of this hydrogen treatment may vary, depending upon the process conditions, and the fluorine-bearing precursor used to provide the chemically reactive fluorine species. Examples of the chemical precursors that may be used in connection with this invention include $H_2$, $CH_4$, other alkanes, and $NH_3$; other precursor compounds may alternatively be used as the hydrogen source, as will be apparent to those skilled in the art having reference to this specification. As discussed above, it is contemplated that either thermal decomposition of the precursor compound, or plasma activation of the hydrogen species may be used, as well as a combination of the two (i.e., plasma enhanced chemical decomposition).

Figure 1A:
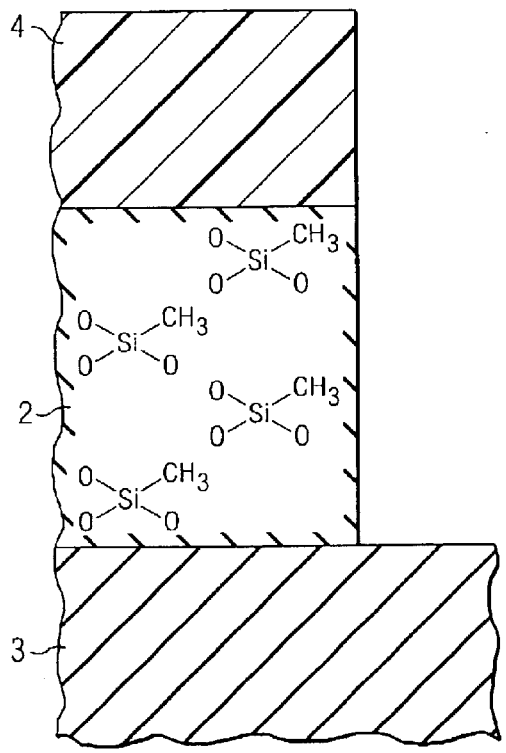
FIGS. 1a through 1d are cross-sectional views of a portion of an integrated circuit structure, formed according to conventional methods, illustrating the reactions due to plasma damage upon low-k dielectric films.
Figure 1B:
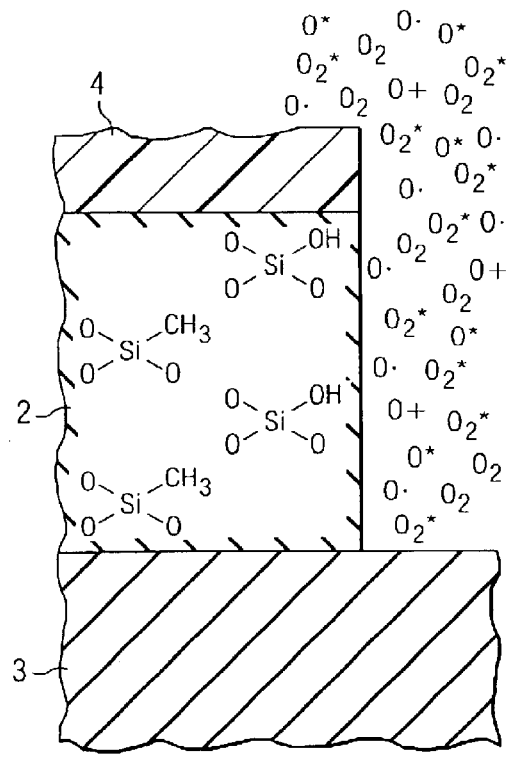
Figure 1C:
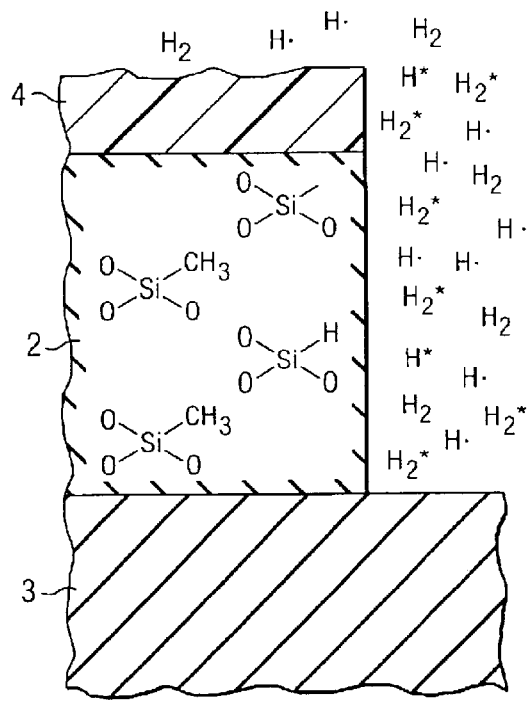
Figure 1D:
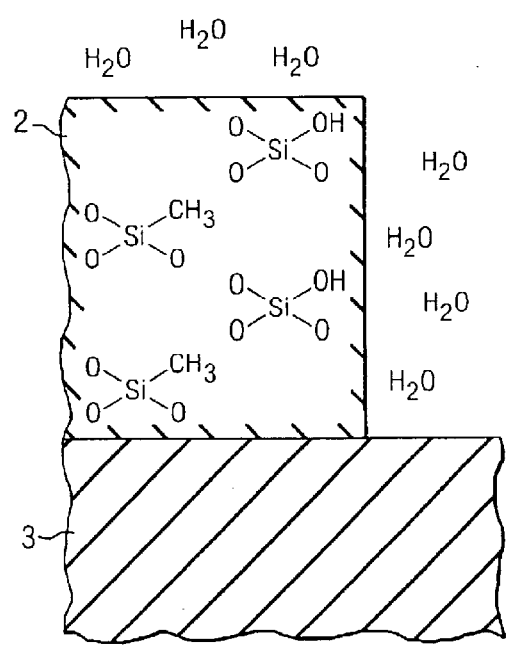

It was mentioned above, relative to FIG. 1c, that hydrogen plasma can be the cause of damage to insulator layer 40, for example in the case of hydrogen plasma photoresist removal processes. The hydrogen treatment according to this second embodiment of the invention, if plasma assisted, is performed under different process conditions than plasma photoresist removal. According to this embodiment of the invention, plasma activation of the hydrogen species is performed at a pressure that is significantly higher than that of hydrogen plasma photoresist removal, for example at 2000 mTorr, and under no bias; effectively, it is excited neutrals, including dissociated hydrogen atoms and hydrogen molecules, that is believed to effect the hydrogen treatment in this case. According to an example of this treatment, the hydrogen treatment is performed at a temperature of about 60° C., for two minutes, at an RF source power of about 700 W, and with a total gas flow of about 2 liters per minute. The source gases are a mixture of hydrogen and argon, with the hydrogen concentration being from 50% to 100%, preferably 60%, of the source gases. A preferred type of plasma tool used for this treatment is commonly known as a downstream plasma tool.

Figure 4A:
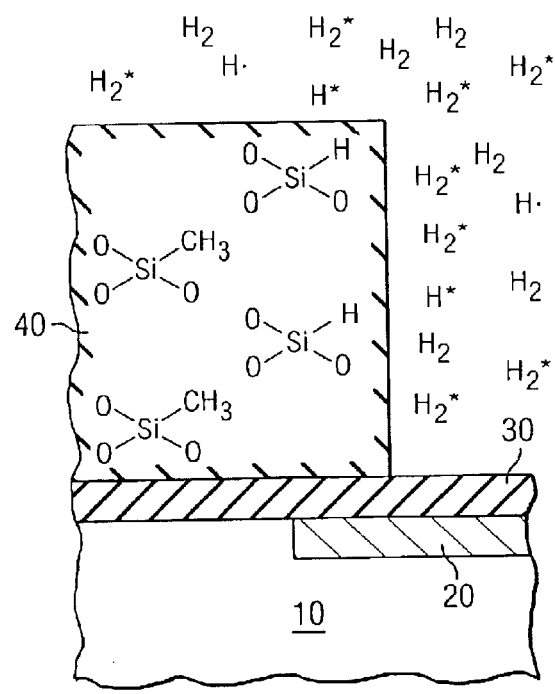
FIG. 4a is a cross-sectional view of a portion of the integrated circuit of FIGS. 2a through 2d, illustrating the reaction for treatment of plasma damage according to a second preferred embodiment of the invention.

According to this embodiment of the invention, the excited hydrogen atoms react with the dangling bonds in the damaged OSG insulator layer 40. It is believed that these dangling bonds are converted to Si—H bonds. As such, it is preferable that the activated hydrogen treatment according to this embodiment of the invention is preferably performed immediately after the damaging plasma treatment, prior to the exposure of the film to moisture. FIG. 4a illustrates this reactions of the activated hydrogen with damaged OSG insulator layer 40, in which molecules with converted Si—H bonds are formed near the surface of insulator layer 40.

Figure 4B:
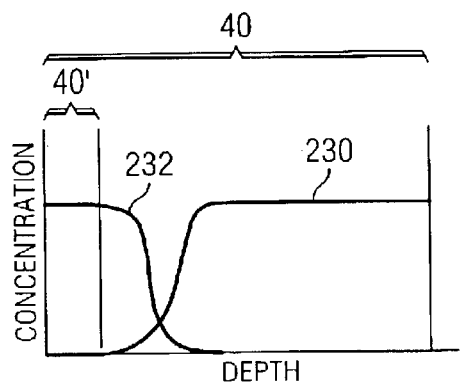
FIG. 4b is a plot of the concentration of various constituents of an insulating layer in the integrated circuit of FIGS. 2a through 2d, following the repair treatment according to the second preferred embodiment of the invention.

In FIG. 4b, the surface concentration of these converted Si—H bonds is illustrated. Plot 230 in FIG. 4b illustrates the depletion of silicon-hydrocarbon bonds from the surface of insulator layer 40, particularly within damaged region 40' at the surface of the film. As shown by plot 232 in FIG. 4b, the activated hydrogen treatment according to this preferred embodiment of the invention converts some of the dangling bonds in this depleted region to Si—H bonds, with the effects continuing even past damaged region 40' into the body of insulator layer 40.

Figure 4C:
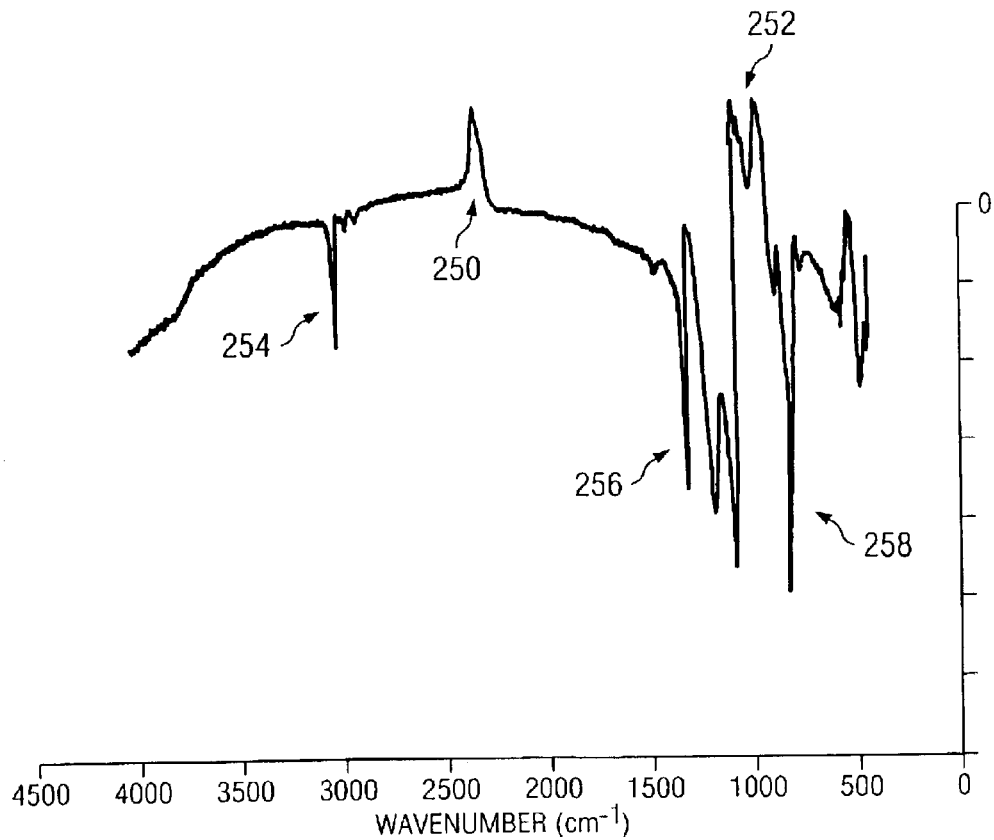
FIG. 4c is an absorption spectrum difference plot illustrating differences in the composition of low-k dielectric film from the repair treatment according to the second preferred embodiment of the invention.

The increase in Si—H bonds resulting from this embodiment of the invention, and the corresponding structural difference of treated insulator layer 40 from conventional OSG insulator films, is believed to be detectable by way of modern measurement techniques, such as FTIR. FIG. 4c is an absorption spectrum difference FTIR plot taken of a portion of OSG insulator material, illustrating the effects of an activated hydrogen treatment according to this embodiment of the invention. In this example MSQ insulator layer 40 was damaged by plasma removal of photoresist, and then treated by way of plasma activation of a gas flow of approximately 2 liters per minute of a mixture of approximately 60% hydrogen and approximately 40% argon, in a downstream plasma tool, with the process temperature of about 60° C., for about 120 seconds, at no bias, with an RF source power of about 700 Watts, and at a pressure of about 2000 mTorr. As evident from FIG. 4b, positive frequency absorption differences 250, 252 at a wavenumber of about 2400 and about 1000 to 1200, respectively, indicates significant increases of silicon-hydrogen bonds (Si—H); it is believed that this increase corresponds to the conversion of dangling bonds to Si—H bonds. On the other hand, negative frequency absorption differences 254, 256, 258, at wavenumbers of about 3100, 1400, and 800, respectively, indicate the loss of some Si—CH$_3$ bonds from the molecules in insulator layer 40. This loss is due to the mechanism by way of which the hydrogen plasma damages MSQ insulator layer 40, as described above relative to FIG. 1c. The particular plasma treatment conditions must therefore be optimized to minimize the loss of Si—CH$_3$ bonds and maximize the formation of Si—H bonds. Indeed, it is contemplated that the hydrogen treatment of this preferred embodiment of the invention may not only convert some dangling bonds to Si—H bonds, but may actually perform the two-step conversion of Si—CH$_3$ bonds to Si—H bonds.

According to this preferred embodiment of the invention, the surface of insulator layer 40 does not necessarily return to its original state, but instead behaves to some extent as a different material. In this example, some of the surface molecules of the MSQ substitution group depleted silicon oxide insulator layer 40 are converted to molecules having Si—H bonds. As a result, treated insulator layer 40 behaves, at its surface, similarly as a hydrogen silsesquioxane (HSQ)-based organosilicate glass, rather than its original formation of organosilicate glass, for example as a methyl silsesquioxane (MSQ)-based OSG. Subsequent processes that are compatible with HSQ-based glasses may therefore be used in connection with this treated OSG, providing further robustness to the process. In this manner, the HSQ-like passivation of the OSG insulator layer 40 protects the insulator layer, and thus protects its critical dimensions as etched, from these subsequent processes.

According to a third embodiment of the invention, insulator layer 40 is treated with activated nitrogen and hydrogen to repair plasma damage by way of a nitridation reaction. Examples of the chemical precursors that may be used in connection with this embodiment of the invention include NH$_3$ and its related substituted compounds, N$_2$ in combination with CH$_4$ or its related alkane hydrocarbons or in combination with H$_2$; other precursor compounds and combinations may alternatively be used as the nitrogen and hydrogen sources, as will be apparent to those skilled in the art having reference to this specification. As discussed above, it is contemplated that either thermal decomposition of the precursor compounds, or plasma activation of the nitrogen and hydrogen species may be used, as well as a combination of the two (i.e., plasma enhanced chemical decomposition). In either case, the thermal or plasma activation results in atomic, molecular, and ionic species of nitrogen and hydrogen that are capable of reacting with molecules at the damaged surface of insulator layer 40.

Figure 5A:
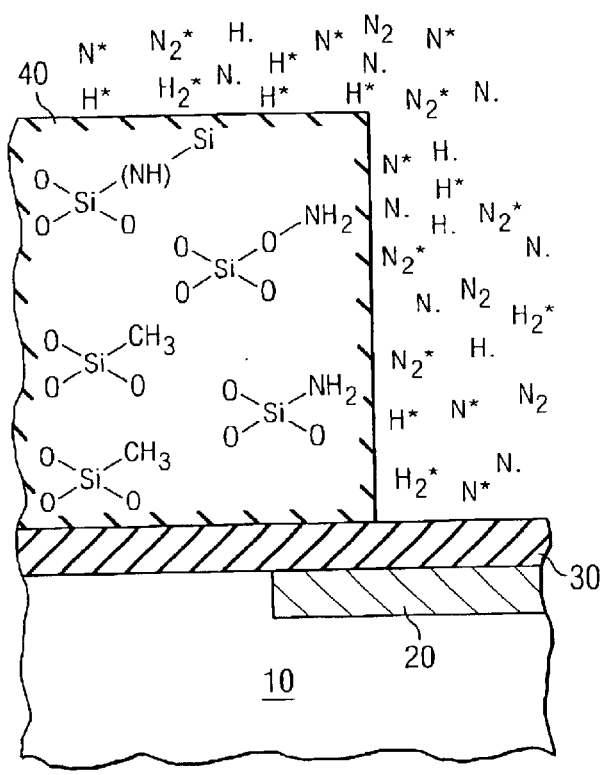
FIG. 5a is a cross-sectional view of a portion of the integrated circuit of FIGS. 2a through 2d, illustrating the reaction for treatment of plasma damage according to a third preferred embodiment of the invention.

According to this embodiment of the invention, the reaction of these activated nitrogen and hydrogen species, in combination, result in the dangling bonds of insulator layer 40 reacting to form bonds such as Si—NH$_2$, Si—O—NH$_2$, and Si—(NH)—Si bonds. Examples of these reactions are illustrated in FIG. 5a. The particular compounds that are formed will depend upon the particular precursors used, as well as the activation conditions. Accordingly, not all of these nitrogen-hydrogen reactions may occur in a particular implementation.

Figure 5B:
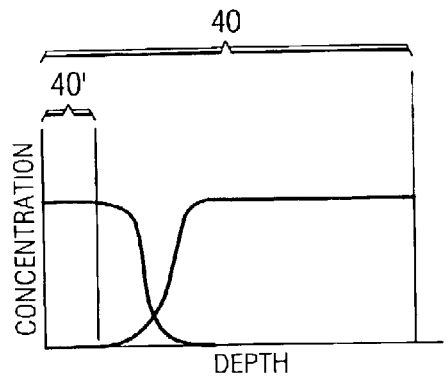
FIG. 5b is a plot of the concentration of various constituents of an insulating layer in the integrated circuit of FIGS. 2a through 2d, following the repair treatment according to the second preferred embodiment of the invention.

FIG. 5b illustrates the relative concentration of the nitrided silicon molecules and silicon-carbohydrate bonds, with varying depth into insulator layer 40, according to this invention. Plot 260 is a plot of the concentration of silicon-carbohydrate bonds, illustrating the depletion of these molecules from the surface of insulator layer 40, within plasma damaged region 40'. As evident from this plot, a significant number of dangling bonds are caused by plasma processes, such as the removal of photoresist and the like. As mentioned above, these dangling bonds are vulnerable to being converted to silanol bonds upon the subsequent exposure of insulator layer 40 to moisture or water vapor. Plot 262 is a plot of the concentration of bonds between the silicon atoms of the substituted group depleted silicon oxide material of insulator layer 40, and molecules of nitrogen and hydrogen, as resulting from the treatment process according to this embodiment of the invention. As evident from plot 262 in FIG. 5b, the concentration of these bonds is significant near the surface of insulator layer 40, particularly in damaged region 40'. As a result, it is contemplated that plasma damage to insulator layer 40 is ameliorated to a significant degree according to this embodiment of the invention.

Figure 5C:
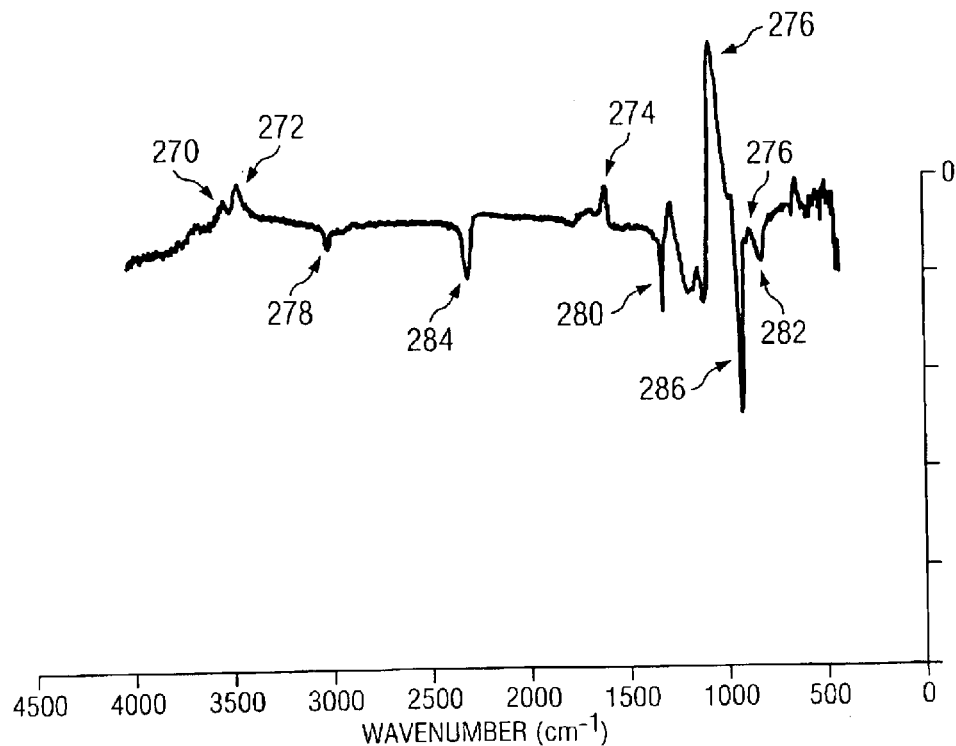
FIG. 5c is an absorption spectrum difference plot illustrating differences in the composition of low-k dielectric film from the repair treatment according to the third preferred embodiment of the invention.

The increase in nitrided silicon bonds resulting from this embodiment of the invention is believed to be detectable by way of modern measurement techniques. FIG. 5c is an absorption spectrum difference FTIR plot taken of a portion of OSG insulator material, illustrating the effects of an activated nitridation treatment according to this embodiment of the invention. In this example OSG insulator layer 40 was damaged by plasma removal of photoresist, and then treated by way of plasma activation of a mixture of NH$_3$ and argon at a temperature of 250° C. for three minutes. The incorporation of NH$_2$ into insulator layer 40 is evidenced by asymmetric stretch 270 and symmetric stretch 272, at wavenumbers about 3500 and 3400, respectively, and by "scissor" 274 at a wavenumber of about 1600. It is also observed, form FIG. 5c, that the NH$_3$ plasma did not result in the undesirable addition of physisorbed H$_2$O, as evidenced by the absence of a peak in the difference plot of FIG. 5b at a wavenumber of about 940. Several byproducts of the reaction according to this embodiment of the invention are apparent, by silicon-hydrocarbon losses indicated by negative differences 278, 280, 282, at wavenumbers of about 2900, 1300, and 800, respectively. The loss of silicon-hydrogen bonds is also evidenced at negative differences 284, 286, at wavenumbers of about 2200, 900, respectively. FIG. 5c thus illustrates that insulator layer 40 is structurally different from conventional OSG insulator films, in that a significant increase in the number of Si—N$_x$H$_y$ bonds at the surface of insulator layer 40 can be detected by modern measurement techniques, such as the FTIR technique.

According also to this preferred embodiment of the invention, the surface of insulator layer 40 does not necessarily return to its original state, but instead behaves to some extent as a different material, specifically as the material of insulator layer 40 itself, passivated with a nitrided surface. In this example, some of the surface molecules of the MSQ substitution group depleted silicon oxide insulator layer 40 are converted to molecules having silicon-nitride bonds of some form. In this manner, the nitride-like passivation of the insulator layer 40 protects the material of the film.

According to each embodiment of the invention, following the activated species treatment illustrated of FIG. 2c, etch stop layer 30 is then removed from the bottom of the via through insulator layer 40. This etch may be a brief plasma etch, or a brief wet etch, and may remove remaining portions of hardmask layer 45. If a plasma etch is used to clear etch stop layer 30 from the bottom of the via, it may be beneficial to perform the plasma treatment after the etch of etch stop layer 30, rather than before etch stop layer 30 is removed as shown in FIG. 2c.

Figure 2D:
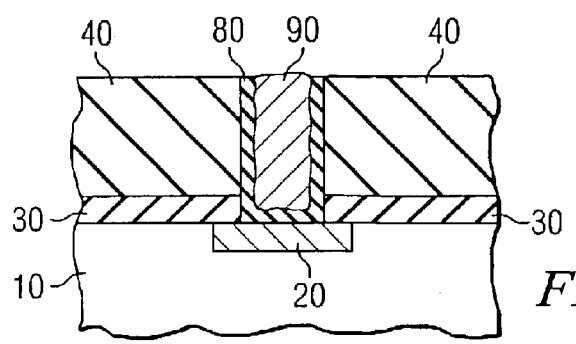

Referring to FIG. 2d, the metallization process then continues, once etch stop layer 30 is removed from the bottom of the via. In this exemplary implementation of the preferred embodiments of the invention, liner layer 80 is formed of the desired material overall. Examples of suitable materials for use as liner layer 80 include titanium nitride, tantalum nitride, tungsten nitride, and the like. After deposition, liner layer 80 will extend not only into the via to lower level conductor 20, but also over the surface of insulating layer 40. Metal 90, preferably copper, is then deposited (or, in the case of copper, electroplated) overall, into the via through insulator layer 40 and also on the surface of insulator layer 40 and liner layer 80, and perhaps also hardmask layer 45 (especially if layer 45 is conductive). Chemical mechanical polishing (CMP) is then performed to remove metal 90 and liner layer 80 from the surface of insulator layer 40, leaving a conductive plug within the via through insulator layer 40, flush with the surface of insulator layer 40. The resulting structure at this point is illustrated in FIG. 2d. The remainder of the interconnect processing then continues in the same, cyclical, manner, to form additional metal conductor levels.

According to each of the embodiments of the invention described above, conventional test and packaging operations are carried out after completion of the fabrication of the semiconductor wafer containing the fabricated integrated circuits. These operations include electrical testing of the integrated circuits in wafer form, dicing and packaging of individual integrated circuits, and final manufacturing testing and burn-in of the packaged integrated circuits. It is contemplated that these conventional processes do not materially change or alter the composition of the integrated circuits made according to the methods of this invention.

Various alternatives to these exemplary implementations of the preferred embodiments of the invention will be apparent to those skilled in the art, having reference to this specification. For example, the trench locations may be kept away from all vias, particularly when the vias are to be filled with conductive plugs of a material other than that of the metal levels. It is contemplated that other process alternatives will be apparent to those skilled in the art having reference to this specification.

In each case, this invention provides important advantages in modern integrated circuit fabrication. This invention enhances the low dielectric constant properties of modern substitution group depleted silicon oxide dielectric materials, such as OSG, by repairing damage to the chemical structure of the films caused by plasma processes. In addition, the resulting low-k dielectric structures have improved structural and chemical stability as a result of this invention, allowing the reliable fabrication of insulating structures of ever-shrinking dimensions. These and other advantages are provided by this invention. Furthermore, according to this invention, the properties of the surface resulting film can be selected by selecting the species to be used in the damage treatment process.

While this invention has been described according to its preferred embodiments, it is of course contemplated that still other modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating an integrated circuit at a surface of a substrate, comprising the steps of:

forming active devices at the surface;

depositing a low dielectric constant insulating layer, comprised of a substitution group depleted silicon oxide, over the active devices;

subjecting the insulating layer to a plasma, the plasma altering some molecules of the substitution group depleted silicon oxide;

after the subjecting step, exposing the insulating layer to an activated species that reacts with molecules of the substitution group depleted silicon oxide that were altered in the subjecting step, wherein the activated species comprises fluorine; and after the exposing step, forming a metal conductor near the insulating layer.

2. The method of claim 1, wherein the substitution group depleted silicon oxide material comprises an organosilicate glass.

3. The method of claim 1, further comprising:

patterning a masking layer at the surface of the insulating layer, to define locations at which openings are to be etched into the insulating layer; and etching the insulating layer, using the patterned masking layer as a mask;

wherein the step of subjecting the insulating layer to a plasma comprises:

after the etching step, removing remaining portions of the patterned masking layer using a plasma process.

4. The method of claim 3, wherein the etching step comprises plasma etching the insulating layer.

5. The method of claim 3, wherein the removing step is performed in a plasma chamber;

and wherein the exposing step is performed in the plasma chamber.

6. The method of claim 5, wherein the exposing step further comprises activating the species with a plasma.

7. The method of claim 3, wherein the removing step is performed in a plasma chamber;

and further comprising:

removing the substrate from the plasma chamber prior to the exposing step.

8. The method of claim 7, wherein the exposing step further comprises thermally activating the species.

9. The method of claim 7, wherein the exposing step further comprises activating the species with a plasma.

10. The method of claim 1, further comprising:

patterning a masking layer at the surface of the insulating layer, to define locations at which openings are to be etched into the insulating layer; and etching the insulating layer, using the patterned masking layer as a mask;

wherein the step of subjecting the insulating layer to a plasma comprises:

after the etching step, removing remaining portions of the patterned masking layer using a plasma;

and wherein the step of forming a metal conductor comprises depositing a metal into the openings formed in the etching step.

11. The method of claim 10, wherein the metal comprises copper.

12. A method of fabricating an integrated circuit at a surface of a substrate, comprising the steps of:

forming active devices at the surface;

depositing an organic low dielectric constant insulating layer over the active devices, the insulating layer comprising a substitution group depleted silicon oxide;

subjecting the insulating layer to a plasma, in which at least some molecules of the substitution group depleted silicon oxide material are broken;

after the subjecting step, exposing the insulating layer to an activated fluorine species that reacts with molecules in the insulating layer in which the silicon-hydrocarbon bonds were broken in the subjecting step; and after the exposing step, forming a metal conductor near the insulating layer.

13. The method of claim 12, further comprising:

thermally activating the fluorine species.

14. The method of claim 12, further comprising:

activating the fluorine species with a plasma.

15. A method of fabricating an integrated circuit at a surface of a substrate, comprising the steps of:

forming active devices at the surface;

depositing an organic low dielectric constant insulating layer over the active devices, the insulating layer comprising a substitution group depleted silicon oxide;

subjecting the insulating layer to a plasma, in which at least some molecules of the substitution group depleted silicon oxide material are broken;

after the subjecting step, exposing the insulating layer to an activated hydrogen species that reacts with molecules in the insulating layer in which the silicon-hydrocarbon bonds were broken in the subjecting step to form molecules having Si—H bonds, wherein a pressure of said exposing step is significantly higher than a pressure of said subjecting step; and after the exposing step, forming a metal conductor near the insulating layer.

16. The method of claim 15, further comprising:

thermally activating the hydrogen species.

17. The method of claim 15, further comprising:

activating the hydrogen species with a plasma.

18. A method of fabricating an integrated circuit at a surface of a substrate, comprising the steps of:

forming active devices at the surface;

depositing an organic low dielectric constant insulating layer over the active devices, the insulating layer comprising a substitution group depleted silicon oxide;

subjecting the insulating layer to a plasma, in which at least some molecules of the substitution group depleted silicon oxide material are broken;

after the subjecting step, exposing the insulating layer to an activated nitrogen species, in combination with an activated hydrogen species, so that the activated nitrogen species reacts with molecules in the insulating layer in which the silicon-hydrocarbon bonds were broken in the subjecting step; and after the exposing step, forming a metal conductor near the insulating layer.

19. The method of claim 18, further comprising:

thermally activating the nitrogen species.

20. The method of claim 18, further comprising:

activating the nitrogen species with a plasma.

* * * * *